United States Patent
Zhang et al.

(10) Patent No.: US 12,184,061 B2
(45) Date of Patent: Dec. 31, 2024

(54) ELECTROSTATIC DISCHARGE AND ELECTRICAL OVERSTRESS DETECTION CIRCUIT

(71) Applicant: MONTAGE TECHNOLOGY CO., LTD., Shanghai (CN)

(72) Inventors: Xiong Zhang, Shanghai (CN); Chunlai Sun, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 265 days.

(21) Appl. No.: 18/071,712

(22) Filed: Nov. 30, 2022

(65) Prior Publication Data

US 2023/0170690 A1    Jun. 1, 2023

(30) Foreign Application Priority Data

Nov. 30, 2021 (CN) .......................... 202111442023.4

(51) Int. Cl.
    *H02H 9/04*       (2006.01)
    *G01R 31/00*     (2006.01)
(52) U.S. Cl.
    CPC .......... *H02H 9/046* (2013.01); *G01R 31/001* (2013.01)
(58) Field of Classification Search
    CPC .... G01R 31/14; G01R 31/129; G01R 31/001; H02H 9/046; H01L 27/0266; H01L 27/0288

USPC .......................................................... 361/56
See application file for complete search history.

(56) References Cited

U.S. PATENT DOCUMENTS

| | | | |
|---|---|---|---|
| 2010/0271742 A1* | 10/2010 | Shannon ................ | H02H 9/046 324/537 |
| 2019/0128939 A1* | 5/2019 | O'Donnell ........... | G01R 31/002 |
| 2021/0210153 A1* | 7/2021 | Li .......................... | G11C 17/16 |
| 2021/0305802 A1* | 9/2021 | Yeh ...................... | H01L 27/0292 |

* cited by examiner

*Primary Examiner* — Kevin J Comber
(74) *Attorney, Agent, or Firm* — Oliff PLC

(57) ABSTRACT

An electrostatic discharge and electrical overstress detection circuit includes protection circuit, sensing circuit, clamp circuit, several stages of sampling logic circuits connected in sequence and storage circuit. Protection circuit is coupled between input/output pin and internal chip and discharges to a power supply terminal when the electrostatic discharge or electrical overstress events happen. Sensing circuit and clamp circuit are coupled between power supply terminal and ground terminal. Each stage of sampling logic circuit is coupled to power supply terminal and memory cell of storage circuit, and the first stage of sampling logic is coupled to the clamp circuit, and when the electrostatic discharge or electrical overstress events happen, the several stages of sampling logic circuits sample voltage of the power supply terminal one by one and change state of corresponding memory cell, so that the electrostatic discharge or electrical overstress events are successively recorded by the memory cell.

11 Claims, 2 Drawing Sheets

ELECTROSTATIC DISCHARGE AND ELECTRICAL OVERSTRESS DETECTION CIRCUIT

REFERENCE TO RELATED APPLICATION

This application claims priority to Chinese Application number CN2021114420234, filed on Nov. 30, 2021, the contents of which are incorporated herein by reference.

TECHNICAL FIELD

The present application generally relates to the field of semiconductor technology, more particularly to an electrostatic discharge and electrical overstress detection circuit.

BACKGROUND

Electrostatic discharge (ESD) refers to discharge process of electrostatic charge accumulated in a chip. Electrical overstress (EOS) refers to working voltage or current applied on a chip exceeding maximum specification. Both ESD and EOS can cause serious damage to chips or systems. According to statistics, the failure caused by ESD and EOS can account for more than 20% of total failure of the chips. According to different discharge modes, ESD can be divided into human body mode (HBM), charged device mode (CDM), and machine mode (MM). ESD discharge time is usually from tens of nanoseconds to tens of microseconds, while EOS discharge time is usually more than milliseconds. The main difference between the two is that ESD is a high-voltage short-time discharge process with relatively low released total energy, while EOS is a low-voltage long-time discharge process with relatively high released total energy. ESD or EOS events may happen during chip manufacturing, transportation, testing, application, etc. However, with the reduction of device size and the thinning of gate oxide, ESD and EOS have a more serious impact on the chips.

However, traditional design can only prevent and protect against ESD and EOS, but cannot detect occurrence of ESD and EOS events. Once a serious ESD or EOS event happens in the chip, the function or reliability of the chip may be affected, which can only be found during the product application process.

Therefore, there is a need for a circuit capable of detecting electrostatic discharge and electrical overstress events.

SUMMARY OF THE INVENTION

An object of the present application is to provide an electrostatic discharge and electric overload detection circuit capable of recording electrostatic discharge and electric overstress events on an input/output pin, and the numbers and stages of occurrence of the electrostatic discharge and electrical overstress events can be obtained from the records.

This application discloses an electrostatic discharge and electrical overstress detection circuit for recording electrostatic discharge and electrical overstress events on an input/output pin coupled with an internal chip. The detection circuit comprises: a protection circuit, a sensing circuit, a clamp circuit, several stages of sampling logic circuits connected in sequence and a storage circuit, wherein the protection circuit is coupled between the input/output pin and the internal chip and discharges to a power supply terminal when the electrostatic discharge or electrical overstress events happen, the sensing circuit and the clamp circuit are coupled between the power supply terminal and a ground terminal, each stage of sampling logic circuit is coupled to the power supply terminal and a memory cell of the storage circuit, and the first stage of sampling logic circuit is coupled to the clamp circuit, and when the electrostatic discharge or electrical overstress events happen, the several stages of sampling logic circuits sample voltage of the power supply terminal one by one and change state of corresponding memory cell, so that the electrostatic discharge or electrical overstress events are successively recorded by the memory cells.

In some embodiments, the clamp circuit comprises a first inverter and an NMOS transistor, an input terminal of the first inverter is coupled to an output terminal of the sensing circuit, an output terminal of the first inverter is coupled to a gate of the NMOS transistor, a drain of the NMOS transistor is coupled to the power supply terminal, and a source of the NMOS transistor is coupled to the ground terminal.

In some embodiments, the first stage of sampling logic circuit in the several stages of sampling logic circuits comprises a second inverter and a PMOS transistor, and each of the other stages of sampling logics in the several stages of sampling logic circuits comprise a NAND gate and a PMOS transistor, wherein an input terminal of the second inverter and a first input terminal of each NAND gate are coupled to an output terminal of the first inverter, an output terminal of the second inverter is coupled to a gate of the PMOS transistor of this stage, an output terminal of each NAND gate is coupled to the gate of the PMOS transistor of this stage, a source of each PMOS transistor is coupled to the power supply terminal, a drain of each PMOS transistor is coupled to a first terminal of the memory cell of this stage, and a second input terminal of each NAND gate is coupled to a third terminal of the memory cell of upper stage.

In some embodiments, a second terminal of the memory cell is coupled to the power supply terminal; and when an electrostatic discharge or electrical overstress event happens on the input/output pin, the drain of the PMOS transistor is conductive with the second input terminal of the NAND gate of next stage.

In some embodiments, the memory cell is an anti-fuse memory cell, and when the electrostatic discharge or electrical overstress event happens on the input/output pin, a gate oxide layer of the anti-fuse memory cell is broken down, and the drain of the PMOS transistor is conductive with the second input terminal of the NAND gate of next stage.

In some embodiments, the memory cell is a flash memory cell, a magnetic random memory cell or a resistance-variable random memory cell, and when the electrostatic discharge and electrical overstress event happens on the input/output pin, the memory cell is erased, and the drain of the PMOS transistor is conductive with the second input terminal of the NAND gate of next stage.

In some embodiments, the first stage of sampling logic circuit in the several stages of sampling logic circuits comprises a second inverter and a PMOS transistor, and each of the other stages of sampling logics in the several stages of sampling logic circuits comprises a NAND gate and a PMOS transistor, wherein an input terminal of the second inverter and a first input terminal of each NAND gate are coupled to an output terminal of the first inverter, an output terminal of the second inverter is coupled to a gate of the PMOS transistor of this stage, an output terminal of each NAND gate is coupled to the gate of the PMOS transistor of this stage, a source of each PMOS transistor is coupled to the power supply terminal, a drain of each PMOS transistor is coupled to one terminal of corresponding memory cell and a second input terminal of the NAND gate of next stage; and the other terminal of the memory cell is coupled to the ground terminal.

In some embodiments, the memory cell is a one-time programmable memory cell, and when the electrostatic discharge and electrical overstress event happens on the input/output pin, the one-time programmable memory cell is disconnected, and the drain of the PMOS transistor is conductive with the second input terminal of the NAND gate of next stage.

In some embodiments, the detection circuit further comprises a readout circuit coupled to the storage circuit and is used to read out state of each memory cell for analyzing numbers and stages of occurrence of the electrostatic discharge and electrical overstress events.

In some embodiments, when the electrostatic discharge and electrical overstress event happens on the input/output pin, one memory cell of the storage circuit is switched from a first state to a second state.

In some embodiments, the protection circuit comprises a first-level protection unit and a second-level protection unit, each of the first-level protection unit and the second-level protection unit comprises a first diode and a second diode, an anode of the first diode is coupled to the input/output pin, and a cathode of the first diode is coupled to the power supply terminal, an anode of the second diode is coupled to the ground terminal, a cathode of the second diode is coupled to the input/output pin, wherein a resistor is coupled between the first-level protection unit and the second-level protection unit, and one terminal of the resistor is coupled to the input/output pin and a node between the first diode and the second diode in the first-level protection unit, the other terminal of the resistor is coupled to the internal chip and a node between the first diode and the second diode in the second-level protection unit.

A large number of technical features are described in the specification of the present application, and are distributed in various technical solutions. If a combination (i.e., a technical solution) of all possible technical features of the present application is listed, the description may be made too long. In order to avoid this problem, the various technical features disclosed in the above summary of the present application, the technical features disclosed in the various embodiments and examples below, and the various technical features disclosed in the drawings can be freely combined with each other to constitute Various new technical solutions (all of which are considered to have been described in this specification), unless a combination of such technical features is not technically feasible. For example, feature A+B+C is disclosed in one example, and feature A+B+D+E is disclosed in another example, while features C and D are equivalent technical means that perform the same function, and technically only choose one, not to adopt at the same time. Feature E can be combined with feature C technically. Then, the A+B+C+D scheme should not be regarded as already recorded because of the technical infeasibility, and A+B+C+E scheme should be considered as already documented.

DETAILED DESCRIPTION

In the following description, numerous technical details are set forth in order to provide the readers with a better understanding of the present application. However, those skilled in the art can understand that the technical solutions claimed in the present application can be implemented without these technical details and various changes and modifications based on the following embodiments.

In order to make the objects, technical solutions and advantages of the present application more clear, embodiments of the present application will be further described in detail below with reference to the accompanying drawings.

Figure 1:
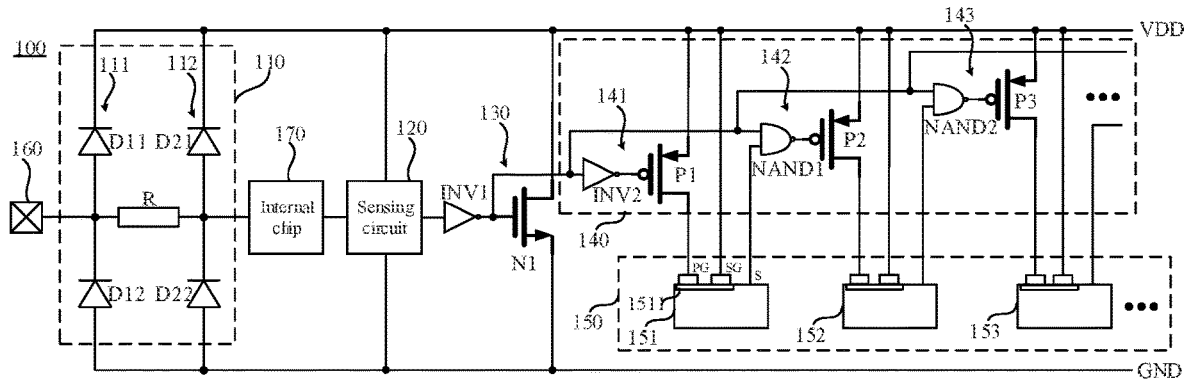
FIG. 1 illustrates a schematic diagram of an electrostatic discharge and electrical overstress detection circuit according to an embodiment of the present application.

An embodiment of the present application discloses an electrostatic discharge and electrical overstress detection circuit, which is used for recording electrostatic discharge and electrical overstress events on an input/output pin coupled with an internal chip. FIG. 1 illustrates a schematic diagram of the detection circuit 100 according to an embodiment of the present application. The detection circuit 100 includes a protection circuit 110, a sensing circuit 120, a clamping circuit 130, several stages of sampling logic circuits 140 connected in sequence and a storage circuit 150. The protection circuit 110 is coupled between an input/output pin 160 and an internal chip 170 and discharges to a power supply terminal VDD when the electrostatic discharge and electrical overstress events happen. The sensing circuit 120 is coupled between the power supply terminal VDD and a ground terminal GND, and the sensing circuit 120 determines whether an electrostatic discharge or electrical overstress event has happened on the input/output pin 160 according to the voltage of the power supply terminal VDD. The clamping circuit 130 is coupled between the power supply terminal VDD and the ground terminal GND, and is used for discharging the overcharge voltage on the power supply terminal VDD to the ground terminal GND, thereby clamping the power supply terminal VDD. Each stage of sampling logic circuits 140 is coupled to the power supply terminal VDD and a memory cell of the storage circuit 150. For example, FIG. 1 illustrates sampling logic circuits 141, 142, and 143, wherein a first stage of sampling logic circuit 141 coupled to a memory cell 151, a second stage of sampling logic circuit 142 coupled to a memory cell 152, and a third stage of sampling logic circuit 143 coupled to a memory cell 153, and so on. Furthermore, the first stage of sampling logic circuit 141 is coupled to the clamp circuit 130. When the electrostatic discharge or electrical overstress events happen, the several stages of sampling logic circuits 140 sample the voltage of the power supply terminal VDD one by one and change the state of the corresponding memory cell in the storage circuit 150, so that the storage circuit 150 records the electrostatic discharge and electrical overstress events successively.

In one embodiment, the protection circuit 110 includes a first-level protection unit 111 and a second-level protection unit 112, each of the first-level protection unit 111 and the second-level protection unit 112 includes a corresponding one of first diodes D11, D21 and a corresponding one of second diodes D12, D22, and anodes of the first diodes D11, D21 are coupled to the input/output pin 160, cathodes of the first diodes D11, D21 are coupled to the power supply terminal VDD, anodes of the second diodes D12, D22 are coupled to the ground terminal GND, cathodes of the second diodes D12, D22 are coupled to the input/output pin 160. A resistor R is coupled between the first-level protection unit 111 and the second-level protection unit 112, one terminal of the resistor R is coupled to the input/output pin 160 and a node between the first diode D11 and the second diode D12 in the first-level protection unit 111, and the other terminal of the resistor R is coupled to the internal chip 170 and a node between the first diode D21 and the second diode D22 in the second-level protection unit 112.

In one embodiment, the clamp circuit 130 includes a first inverter INV1 and an NMOS transistor N1, an input terminal of the first inverter INV1 is coupled to an output terminal of the sensing circuit 120, an output terminal of the first inverter INV1 is coupled to a gate of the NMOS transistor N1, a drain of the NMOS transistor N1 is coupled to the power supply terminal VDD, and a source of the NMOS transistor N1 is coupled to the ground terminal GND.

In one embodiment, the first stage of sampling logic circuit 141 comprises a second inverter INV2 and a PMOS transistor P1, and the other stages of sampling logic circuits comprise NAND gates and PMOS transistors. For example, the second stage of sampling logic circuit 142 comprises a NAND gate NAND1 and a PMOS transistor P2, and the third stage of sampling logic circuit 143 comprises a NAND gate NAND2 and a PMOS transistor P3, and so on. An input terminal of the second inverter INV2 and a first input terminal of each NAND gate (e.g., NAND1, NAND2) are coupled to the output terminal of the first inverter INV1. An output terminal of the second inverter INV2 is coupled to a gate of the PMOS transistor P1 of this stage. An output terminal of each NAND gate is coupled to a gate of the PMOS transistor in the same stage, for example, an output terminal of the NAND gate NAND1 is coupled to a gate of the PMOS transistor P2, an output terminal of the NAND gate NAND2 is coupled to a gate of the PMOS transistor P3, and so on. A source of each PMOS transistor is coupled to the power supply terminal VDD, a drain of each PMOS transistor is coupled to a first terminal of a memory cell of this stage, and a second input terminal of each NAND gate is coupled to a third terminal of the memory cell of upper stage. For example, the drain of the PMOS transistor P1 of the first stage of sampling logic circuit 141 is coupled to the first terminal of the first stage memory cell 151, the second input terminal of the NAND gate NAND1 of the second stage of sampling logic circuit 142 is coupled to the third terminal of the first stage memory cell 151, the drain of the PMOS transistor P2 of the second stage of sampling logic circuit 142 is coupled to the first terminal of the second stage memory cell 152, and the second input terminal of the NAND gate NAND2 of the third stage of sampling logic circuit 143 is coupled to the third terminal of the second stage memory cell 152, and so on.

Figure 2:
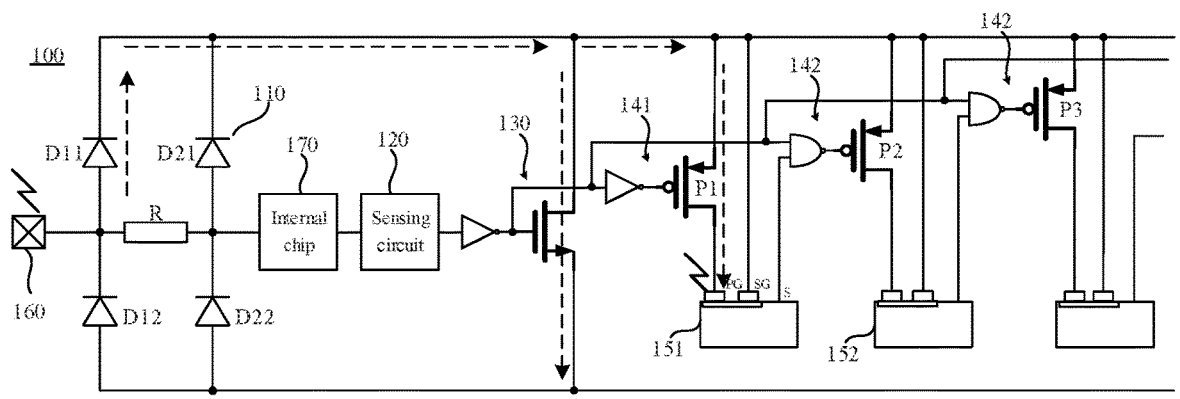
FIG. 2 illustrates a schematic diagram of current flow in a detection circuit when an electrostatic discharge or electrical overstress event happens for a first time according to an embodiment of the present application.

It should be noted that, in the embodiments shown in FIGS. 1 and 2, the protection circuit 110 includes a two-level protection circuit, and the sampling logic circuits 140 include at least three stages of sampling logic circuits, but the present application is not limited thereto.

The memory cells of the storage circuit 150 in this application may be memory cells with one or more bits, and one of the memory cells in the storage circuit 150 switches from a first state to a second state when the electrostatic discharge or electrical overstress event happens on the input/output pin 160. For example, in one embodiment, the memory cell is switched from a low level (or "0") to a high level (or "1"). It should be understood that in other embodiments of the present application, the memory cell may also be switched from a high level (or "1") to a low level (or "0").

In one embodiment, the storage circuit 150 may have memory cells of 8 bits to 128 bits, for example, 32 bits, 64 bits, etc. There are usually multiple input/output pins on the integrated circuit chips, and electrostatic discharge or electrical overstress events may happen on each input/output pin. In one embodiment, one storage circuit can be used to record electrostatic discharge and electrical overstress events on the multiple input/output pins, for example, a part of memory cells in the storage circuit (such as, memory cells on a row in a memory array) record electrostatic discharge and electrical overstress events happening on one input/output pin.

In one embodiment, the memory cell is an anti-fuse memory cell, and a second terminal of the anti-fuse memory cell is coupled to the power supply terminal VDD. Continuing to refer to FIG. 1, the anti-fuse memory cell has a first terminal (PG), a second terminal (SG), and a third terminal (S), wherein the first terminal is a gate of a program transistor, the second terminal is a gate of a selector transistor, and the third terminal is a source terminal, wherein the first terminal is coupled to the drain of the PMOS transistor, the second terminal is coupled to the power supply terminal, and the third terminal is coupled to the input terminal of the NAND gate of the memory cell of next stage. An insulating layer (e.g., a gate oxide layer 1511) is provided between the first and second terminals and a substrate (the substrate is equipotential with the third terminal). When the electrostatic discharge or electrical overstress event happens on the input/output pin 160, the PMOS transistor of one stage of sampling logic circuit is turned on, and the overcharge generated on the power supply terminal VDD will flow to the first terminal of the memory cell and break down the gate oxide layer between the first terminal and the substrate, and at the same time, the selector transistor connects to the power supply terminal VDD, and the channel below the selector transistor is turned on, so that the first terminal and the third terminal are electrically turned on, causing the memory state of the memory cell to change (from unprogrammed to programmed) to record the current electrostatic discharge or electrical overstress event and to make the drain of the PMOS transistor conductive with the second input terminal of the NAND gate of next stage.

Figure 3:
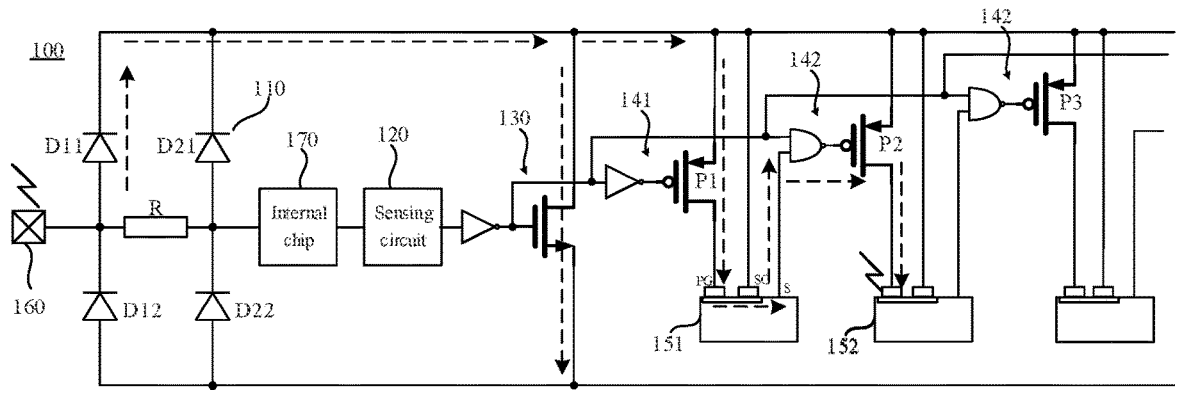
FIG. 3 illustrates a schematic diagram of current flow in a detection circuit when the electrostatic discharge or electrical overstress event happens for a second time according to an embodiment of the present application.

FIG. 2 illustrates a schematic diagram of current flow in the detection circuit when the electrostatic discharge or electrical overstress event happens for the first time on the input/output pin 160. The current flows from the first diodes D11 and D21 of the protection circuit to the power supply terminal VDD. The sensing circuit 120 detects occurrence of the electrostatic discharge or electrical overstress event and turns on the clamp circuit 130 and the first stage of sampling logic circuit 141. Portion of the charge is discharged to the ground terminal GND through the clamp circuit 130, and portion of the charge flows to the first terminal of the memory cell 151 through the PMOS transistor P1 and breaks down the gate oxide layer between the first terminal and the substrate. The memory cell 151 is switched from a low level to a high level to record the first electrostatic discharge or electrical overstress event. Moreover, the PMOS transistor P2 of the sampling logic circuit 142 is turned on. FIG. 3 illustrates a schematic diagram of current flow in the detection circuit when the electrostatic discharge or electrical overstress event happens for a second time. When the electrostatic discharge or electrical overstress event happens again, portion of the charge flows to the first terminal of the memory cell 152 through the PMOS transistor P2 and breaks down the gate oxide layer between the first terminal and the substrate, and the memory cell 152 is switched from a low level to a high level to record the second electrostatic discharge or electrical overstress event. When a subsequent electrostatic discharge or electrical overstress event happens again, the memory cell 153 is switched from a low level to a high level to record the electrostatic discharge or electrical overstress event, and so on. The detection circuit of the present embodiment can record each occurrence of the electrostatic discharge or electrical overstress events.

Table 1 shows NAND gate delay under different processes. Table 2 shows the parameters of electrostatic discharge or electrical overstress events. From Tables 1 and 2, it can be seen that the NAND gate delay is on the order of tens of picoseconds (ps), while the rising time of the current when electrostatic discharge or electrical overstress events happen is usually on the order of several hundred picoseconds (ps) to nanoseconds (ns) or even milliseconds (ms), which is much higher than the NAND gate delay. Therefore, the starting speed of the NAND gate is sufficient to respond to electrostatic discharge or electrical overstress events.

TABLE 1

| NAND gate delay under different processes | |
|---|---|
| Process | NAND gate delay |
| 40 nm | 30~50 ps |
| 28/22 nm | 25~40 ps |
| 16 nm | 20~30 ps |

TABLE 2

| Parameters of electrostatic discharge or electrical overstress events | | | | | |
|---|---|---|---|---|---|
| | | Rising time | Pulse width | Peak current (A) | Energy |
| ESD | HBM | 2~10 ns | 150 ns | 1.5 | 100 nJ |
| | CDM | <400 ps | 1 ns | 5~6 | 1~10 nJ |
| | MM | 1 ns | 80 ns | 3 | 100 nJ |
| EOS | | ns~ms | us~s | >10 | 50~500 uJ |

It should be noted that the generated energy when the electrostatic discharge or electrical overstress event happens usually causes a memory cell to change its state, for example, a moderate level electrostatic discharge or electrical overstress event, for example, an HBM below 2 kV or a CDM below 500 volts. However, in some extreme cases, the generated energy may cause two memory cells to change their states, for example, a high level electrostatic discharge or electrical overstress event, for example, an HBM above 4 kV or a CDM above 800 volts.

After the manufacturing of integrated circuit chips is completed, they may go through stages such as Chip Probing test, package, Final Test, lab test, user assembly line, user application, etc. Each stage may include different sub-stages. The electrostatic discharge or electrical overstress events may happen on the integrated circuit chips at various stages, and the detection circuit of the present application may record the electrostatic discharge or electrical overstress events happening at various stages in the storage circuit.

In one embodiment, the detection circuit 100 further includes a readout circuit (not shown), which is coupled to the storage circuit 150 and reads out the state of each memory cell for analyzing the numbers and stages of occurrence of the electrostatic discharge and electrical overstress events. Table 3 shows the state of the storage circuit in one embodiment.

TABLE 3

| State table of the storage circuit | | |
|---|---|---|
| Stage | State | Determination result |
| CP test start | 00000000 | No ESD/EOS events happened before CP test |
| CP test end | 10000000 | One ESD/EOS event happened during CP test. |
| FT test start | 10000000 | No ESD/EOS events happened during CP test to FT test |
| FT test end | 10000000 | No ESD/EOS events happened during FT test |
| Lab test | 11100000 | Two moderate level ESD/EOS events or one high level ESD/EOS event happened during FT test to the lab test. |
| User assembly line | 11100000 | No ESD/EOS events happened during the user assembly line. |
| User application | 11100000 | No ESD/EOS events happened during the user application |
| . . . | . . . | . . . |

The electrostatic discharge and electrical overstress detection circuit of this application detects and records ESD/EOS events through logic gates and storage circuit, and analyzes the ESD/EOS events recorded in the storage circuit to obtain the numbers and stages of electrostatic discharge and electrical overstress events, so that the failure chips can be found and quickly locked in advance. On one hand, it can prevent chips impacted by ESD/EOS from flowing into customers and users during manufacturing and testing, which causes serious quality problems. On the other hand, it can optimize design and provide support for solving problems at the source based on recorded information.

Another embodiment of the present application provides an electrostatic discharge and electrical overstress detection circuit. The structure of the detection circuit (not shown in the figures) of this embodiment is basically the same as that of the detection circuit 100 shown in FIGS. 1 to 3 in the previous embodiment. The main difference lies in, in this embodiment, the memory cell is one of flash memory cell, magnetic random memory cell (MRAM cell) or resistance variable random memory cell (RRAM cell), the drain of each PMOS transistor is coupled to the first terminal of the memory cell of this stage, and the second input terminal of each NAND gate is coupled to the third terminal of the memory cell of upper stage, the second terminal of the memory cell is coupled to the power supply terminal. When the electrostatic discharge and electrical overstress event happens on the input/output pin, the memory cell is erased, and the drain of the PMOS transistor is conductive with the second input terminal of NAND gate of next stage.

Taking the example of a flash memory cell as the memory cell, a first terminal of the flash memory cell is a control gate (CG), a second terminal is a drain terminal (D), a third terminal is a source terminal (S), the control gate is coupled to the drain of the PMOS transistor, the drain terminal is coupled to the power supply terminal, and the source terminal is coupled to the input terminal of the NAND gate of the memory cell of next stage. An insulating layer (e.g., a gate oxide layer) is provided between the control gate and drain terminal and the source terminal, respectively. When the electrostatic discharge or electrical overstress event happens on the input/output pin 160, the PMOS transistor of one stage of sampling logic circuit is turned on. The overcharge generated on the power supply terminal VDD will flow to the control gate of the memory cell to generate an instantaneous high voltage. The high voltage will generate a strong electric field between the control gate and a floating gate. Under the action of the strong electric field, electrons in the floating gate are collected by the control gate through tunneling, so that the storage state of the memory cell is changed to record the current electrostatic discharge and electrical overload event, and make the drain of the PMOS transistor conductive with the second input terminal of the NAND gate of next stage.

Figure 4:
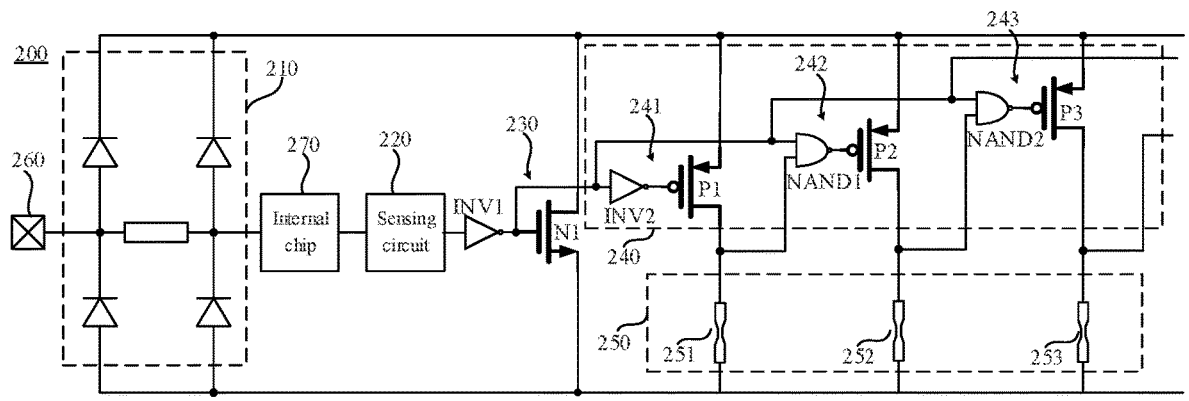
FIG. 4 illustrates a schematic diagram of an electrostatic discharge and electrical overstress detection circuit according to another embodiment of the present application.

FIG. 4 illustrates a schematic diagram of an electrostatic discharge and electrical overstress detection circuit 200 according to another embodiment of the present application.

The protection circuit 210, the sensing circuit 220, the clamp circuit 230, and the sampling logic circuit 240 are the same as those of the protection circuit 110, the sensing circuit 120, the clamp circuit 130, and the sampling logic circuit 140 in the first embodiment, and will not be repeated herein.

The first stage of sampling logic circuit 241 includes a second inverter INV2 and a PMOS transistor P1, and the other stages of sampling logic circuits include NAND gates and PMOS transistors. For example, the second stage of sampling logic circuit 242 includes a NAND gate NAND1 and a PMOS transistor P2, and the third stage of sampling logic circuit 243 includes a NAND gate NAND2 and a PMOS transistor P3, and so on. The storage circuit 250 includes several memory cells, for example, memory cells 251, 252, and 253. In this embodiment, the memory cells 251, 252, and 253 are one-time programmable memory cells (or, eFuse memory cell), a drain of each PMOS transistor is coupled to one terminal of a corresponding memory cell and a second input terminal of the NAND gate of next stage, and the other terminal of the memory cell is coupled to the ground terminal. For example, the drain of the PMOS transistor P1 is coupled to one terminal of the memory cell 251 and the second input terminal of the NAND gate NAND1, the other terminal of the memory cell 251 is coupled to the ground terminal GND, the drain of the PMOS transistor P2 is coupled to one terminal of the memory cell 252 and the second input terminal of the NAND gate NAND2, the other terminal of the memory cell 252 is coupled to the ground terminal GND, and so on.

Figure 5:
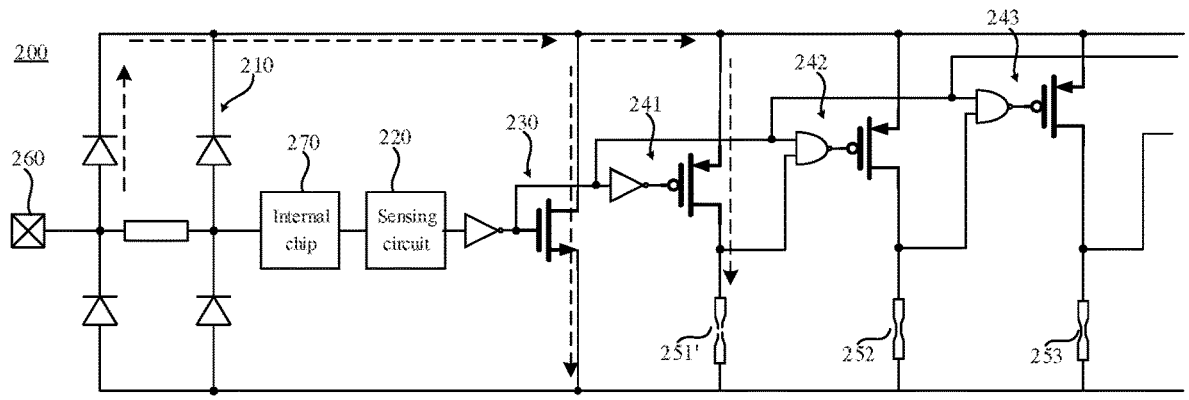
FIG. 5 illustrates a schematic diagram of current flow in a detection circuit when an electrostatic discharge or electrical overstress event happens according to another embodiment of the present application.

In one embodiment, when the electrostatic discharge or electrical overstress event happens on the input/output pin 260, the one-time programmable memory cell is disconnected, and the drain of the PMOS transistor is conductive with the second input terminal of the NAND gate of next stage. Specifically, the overcharge generated on the power supply terminal VDD will flow to the one-time programmable memory cell, so that the storage state of the memory cell changes to record the current electrostatic discharge or electrical overstress event, and make the drain of the PMOS transistor conductive with the second input terminal of the NAND gate of next stage. FIG. 5 illustrates a schematic diagram of current flow in the detection circuit when the electrostatic discharge or electrical overstress event happens for the first time in this embodiment. The overcharge generated on the power supply terminal VDD will flow to the memory cell 251, so that the memory cell 251 is disconnected, and the overcharge will flow to the input terminal of the NAND gate NAND1.

It should be noted that energy requirement per bit for switching different types of memory cells are shown in Table 4, and combined with energy of different types of ESD/EOS in Table 2, it can be seen that the corresponding relationship between different types of memory cells applicable to electrostatic discharge and electrical overstress is shown in Table 4, and different types of memory cells can be selected according to needs in this embodiment.

TABLE 4

| | Corresponding relationship between memory cells and electrostatic discharge and electrical overstress | | | |
|---|---|---|---|---|
| Memory cell type | Programming time | Programming current | Energy requirement (per bit) | Applicable application |
| Flash | <10 us | <10 uA | 10~100 pJ | ESD/EOS |
| eFuse | 15 us | 30 mA | 3~10 nJ | EOS |

TABLE 4-continued

Corresponding relationship between memory cells and
electrostatic discharge and electrical overstress

| Memory cell type | Programming time | Programming current | Energy requirement (per bit) | Applicable application |
|---|---|---|---|---|
| Anti-Fuse | 5 us | 5 mA | 0.1 nJ | ESD/EOS |
| MRAM | 100 ns | <5 uA | 0.1 pJ | ESD/EOS |
| RRAM | 1 us | 1 uA | 0.1 pJ | ESD/EOS |

It should be noted that in this specification of the application, relational terms such as the first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a multiple elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

The term "coupled to" and its derivatives can be used herein. "Coupled" may mean that two or more elements are in direct physical or electrical contact. However, "coupled" may also mean that two or more elements are indirectly in contact with each other, but still cooperate or interact with each other, and may mean that one or more other elements are coupled between elements that are said to be coupled to or connected with each other.

The specification includes combinations of the various embodiments described herein. Separate references to embodiments (such as "an embodiment" or "some embodiments" or "preferred embodiments") do not necessarily refer to the same embodiment; however, these embodiments are not mutually exclusive unless indicated as mutually exclusive or clearly mutually exclusive by those skilled in the art. It should be noted that unless the context clearly indicates or requires otherwise, the word "or" is used in this specification in a non-exclusive sense.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

What is claimed is:

1. An electrostatic discharge and electrical overstress detection circuit for recording electrostatic discharge and electrical overstress events on an input/output pin coupled with an internal chip, wherein the detection circuit comprises: a protection circuit, a sensing circuit, a clamp circuit, several stages of sampling logic circuits connected in sequence and a storage circuit, wherein the protection circuit is coupled between the input/output pin and the internal chip and discharges to a power supply terminal when the electrostatic discharge or electrical overstress events happen, the sensing circuit and the clamp circuit are coupled between the power supply terminal and a ground terminal, each stage of sampling logic circuit is coupled to the power supply terminal and a memory cell of the storage circuit, and the first stage of sampling logic circuit is coupled to the clamp circuit, and when the electrostatic discharge or electrical overstress events happen, the several stages of sampling logic circuits sample voltage of the power supply terminal one by one and change state of corresponding memory cell, so that the electrostatic discharge or electrical overstress events are successively recorded by the memory cells.

2. The electrostatic discharge and electrical overstress detection circuit according to claim 1, wherein the clamp circuit comprises a first inverter and an NMOS transistor, an input terminal of the first inverter is coupled to an output terminal of the sensing circuit, an output terminal of the first inverter is coupled to a gate of the NMOS transistor, a drain of the NMOS transistor is coupled to the power supply terminal, and a source of the NMOS transistor is coupled to the ground terminal.

3. The electrostatic discharge and electrical overstress detection circuit according to claim 2, wherein the first stage of sampling logic circuit in the several stages of sampling logic circuits comprises a second inverter and a PMOS transistor, and each of the other stages of sampling logic circuits in the several stages of sampling logic circuits comprise a NAND gate and a PMOS transistor, wherein an input terminal of the second inverter and a first input terminal of each NAND gate are coupled to an output terminal of the first inverter, an output terminal of the second inverter is coupled to a gate of the PMOS transistor of this stage, an output terminal of each NAND gate is coupled to the gate of the PMOS transistor of this stage, a source of each PMOS transistor is coupled to the power supply terminal, a drain of each PMOS transistor is coupled to a first terminal of the memory cell of this stage, and a second input terminal of each NAND gate is coupled to a third terminal of memory cell of upper stage.

4. The electrostatic discharge and electrical overstress detection circuit according to claim 3, wherein a second terminal of the memory cell is coupled to the power supply terminal; and when an electrostatic discharge or electrical overstress event happens on the input/output pin, the drain of the PMOS transistor is conductive with the second input terminal of the NAND gate of next stage.

5. The electrostatic discharge and electrical overstress detection circuit according to claim 4, wherein the memory cell is an anti-fuse memory cell, and when the electrostatic discharge or electrical overstress event happens on the input/output pin, a gate oxide layer of the anti-fuse memory cell is broken down, and the drain of the PMOS transistor is conductive with the second input terminal of the NAND gate of next stage.

6. The electrostatic discharge and electrical overstress detection circuit according to claim 4, wherein the memory cell is a flash memory cell, a magnetic random memory cell or a resistance-variable random memory cell, and when the electrostatic discharge and electrical overstress event happens on the input/output pin, the memory cell is erased, and the drain of the PMOS transistor is conductive with the second input terminal of the NAND gate of next stage.

7. The electrostatic discharge and electrical overstress detection circuit according to claim 2, wherein the first stage of sampling logic circuit in the several stages of sampling logic circuits comprises a second inverter and a PMOS transistor, and each of the other stages of sampling logics in the several stages of sampling logic circuits comprises a NAND gate and a PMOS transistor, wherein an input terminal of the second inverter and a first input terminal of each NAND gate are coupled to an output terminal of the first inverter, an output terminal of the second inverter is coupled to a gate of the PMOS transistor of this stage, an output terminal of each NAND gate is coupled to the gate of the PMOS transistor of this stage, a source of each PMOS transistor is coupled to the power supply terminal, a drain of each PMOS transistor is coupled to one terminal of corresponding memory cell and a second input terminal of the NAND gate of next stage; and the other terminal of the memory cell is coupled to the ground terminal.

8. The electrostatic discharge and electrical overstress detection circuit according to claim 6, wherein the memory cell is a one-time programmable memory cell, and when the electrostatic discharge and electrical overstress event happens on the input/output pin, the one-time programmable memory cell is disconnected, and the drain of the PMOS transistor is conductive with the second input terminal of the NAND gate of next stage.

9. The electrostatic discharge and electrical overstress detection circuit according to claim 1, further comprising a readout circuit coupled to the storage circuit and is used to read out state of each memory cell for analyzing numbers and stages of occurrence of the electrostatic discharge and electrical overstress events.

10. The electrostatic discharge and electrical overstress detection circuit according to claim 1, wherein when an electrostatic discharge and electrical overstress event happens on the input/output pin, one memory cell of the storage circuit is switched from a first state to a second state.

11. The electrostatic discharge and electrical overstress detection circuit according to claim 1, wherein the protection circuit comprises a first-level protection unit and a second-level protection unit, each of the first-level protection unit and the second-level protection unit comprises a first diode and a second diode, an anode of the first diode is coupled to the input/output pin, and a cathode of the first diode is coupled to the power supply terminal, an anode of the second diode is coupled to the ground terminal, a cathode of the second diode is coupled to the input/output pin, wherein a resistor is coupled between the first-level protection unit and the second-level protection unit, and one terminal of the resistor is coupled to the input/output pin and a node between the first diode and the second diode in the first-level protection unit, the other terminal of the resistor is coupled to the internal chip and a node between the first diode and the second diode in the second-level protection unit.

* * * * *